United States Patent
Lutwak

(10) Patent No.: US 12,155,395 B2
(45) Date of Patent: *Nov. 26, 2024

(54) TECHNIQUES FOR CONTROLLING VAPOR PRESSURE OF SUBJECT MATERIALS IN VAPOR CELLS AND RELATED METHODS

(71) Applicant: Microchip Technology Incorporated, Chandler, AZ (US)

(72) Inventor: Robert Lutwak, Marblehead, MA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/365,711

(22) Filed: Aug. 4, 2023

(65) Prior Publication Data

US 2023/0387927 A1   Nov. 30, 2023

Related U.S. Application Data

(63) Continuation of application No. 17/452,302, filed on Oct. 26, 2021, now Pat. No. 11,750,203.
(Continued)

(51) Int. Cl.
*H03L 7/26* (2006.01)
*G04F 5/14* (2006.01)
*G05D 16/04* (2006.01)

(52) U.S. Cl.
CPC ............... *H03L 7/26* (2013.01); *G04F 5/14* (2013.01); *G05D 16/04* (2013.01)

(58) Field of Classification Search
CPC .............. H03L 7/26; G04F 5/14; G05D 16/04
(Continued)

(56) References Cited

U.S. PATENT DOCUMENTS

| | | |
|---|---|---|
| 4,495,478 A | 1/1985 | Kwon et al. |
| 5,441,575 A | 8/1995 | Underwood et al. |

(Continued)

FOREIGN PATENT DOCUMENTS

| | | | |
|---|---|---|---|
| EP | 2629159 A2 * | 8/2013 | ............ C22B 26/10 |
| EP | 3244269 A1 | 11/2017 | |

(Continued)

OTHER PUBLICATIONS

Hirai et al., "Low Temperature Wafer-Level Process of Alkali-Metal Vapor Cells for Micro-Fabricated Atomic Clocks", 2017 19th International Conference on Solid-State Sensors, Actuators and Microsystems (Transducers), IEEE, (Jun. 18, 2017) pp. 431-434.
(Continued)

*Primary Examiner* — Arnold M Kinkead
(74) *Attorney, Agent, or Firm* — TraskBritt

(57) ABSTRACT

Methods of using vapor cells may involve providing a vapor cell including a body defining a cavity within the body. At least a portion of at least one surface of the vapor cell within the cavity may include at least one pore having an average dimension of about 500 microns or less, as measured in a direction parallel to the at least one surface. A vapor pressure of a subject material within the cavity may be controlled utilizing the at least one pore by inducing an exposed surface of a subject material in a liquid state within the at least one pore to have a shape different than a shape the exposed surface of the subject material in a liquid state would have on a flat, nonporous surface.

20 Claims, 10 Drawing Sheets

Related U.S. Application Data

(60) Provisional application No. 63/203,322, filed on Jul. 16, 2021.

(58) Field of Classification Search
USPC .................................................. 331/3, 94.1
See application file for complete search history.

(56) References Cited

U.S. PATENT DOCUMENTS

| | | | |
|---|---|---|---|
| 5,533,393 | A | 7/1996 | Bonne et al. |
| 6,495,479 | B1 | 12/2002 | Wu et al. |
| 8,999,123 | B2 | 4/2015 | Bernstein et al. |
| 9,117,563 | B2 | 8/2015 | Hughes et al. |
| 9,654,125 | B2 * | 5/2017 | Nakajima ............. G04F 5/145 |
| 9,763,314 | B1 | 9/2017 | Roper et al. |
| 9,766,593 | B2 | 9/2017 | Burt et al. |
| 10,461,760 | B2 | 10/2019 | Gobet et al. |
| 10,749,539 | B2 | 8/2020 | Kriz et al. |
| 10,775,748 | B1 | 9/2020 | Roper et al. |
| 10,828,618 | B1 | 11/2020 | Roper et al. |
| 11,043,349 | B1 | 6/2021 | Roper |
| 11,750,203 | B2 * | 9/2023 | Lutwak ............. G05D 16/04 137/12 |
| 2015/0226669 | A1 | 8/2015 | Compton |
| 2015/0270843 | A1 | 9/2015 | Nakajima et al. |
| 2015/0372686 | A1 | 12/2015 | Parsa et al. |
| 2015/0378316 | A1 | 12/2015 | Parsa et al. |
| 2016/0105149 | A1 * | 4/2016 | Ishihara ............. G04F 5/145 53/467 |
| 2016/0294402 | A1 | 10/2016 | Dyer et al. |
| 2017/0315044 | A1 | 11/2017 | Krishnan |
| 2018/0003778 | A1 | 1/2018 | Miyazawa |
| 2019/0077656 | A1 | 3/2019 | Cook et al. |
| 2019/0181871 | A1 | 6/2019 | Matsuda |
| 2019/0323952 | A1 | 10/2019 | Nelson et al. |
| 2020/0345259 | A1 | 11/2020 | Garber et al. |

FOREIGN PATENT DOCUMENTS

| | | | |
|---|---|---|---|
| EP | 2629159 B1 | 5/2019 | |
| EP | 3477275 A1 | 5/2019 | |
| WO | WO-2020099853 A1 * | 5/2020 | ............. B82Y 30/00 |
| WO | WO-2021005051 A1 * | 1/2021 | ......... G01R 33/0052 |

OTHER PUBLICATIONS

International Search Report from International Application No. PCT/US2021/072038, mailed Mar. 15, 2022, 5 pages.

International Written Opinion from International Application No. PCT/US2021/072038, mailed Mar. 15, 2022, 8 pages.

Liew et al., "Microfabricated Alkali Atom Vapor Cells", Applied Physics Letters, vol. 84, No. 14, (Apr. 5, 2007) pp. 2694-2696.

* cited by examiner

TECHNIQUES FOR CONTROLLING VAPOR PRESSURE OF SUBJECT MATERIALS IN VAPOR CELLS AND RELATED METHODS

CROSS-REFERENCE TO RELATED APPLICATIONS

This application is a continuation of U.S. patent application Ser. No. 17/452,302, filed Oct. 26, 2021, now U.S. Pat. No. 11,750,203, issued Sep. 5, 2023, which claims the benefit under 35 U.S.C. § 119 (e) of the priority date of U.S. Provisional Patent Application Ser. No. 63/203,322, filed Jul. 16, 2021, for EMPLOYING MICROPORE SURFACES FOR CONTROLLING ALKALI-METAL VAPOR PRESSURE IN AN ATOMIC CLOCK AND RELATED VAPOR CELLS, ATOMIC CLOCK AND METHODS, the disclosure of each of which is incorporated herein in its entirety by this reference.

FIELD

This disclosure relates generally to techniques for controlling vapor pressure of subject materials in vapor cells for atomic clocks and other applications. More specifically, disclosed examples relate to structures and materials for controlling alkali-metal vapor pressure, which may improve reliability of operation across broader temperature ranges.

BACKGROUND

Vapor pressure is affected by surface tension according to the Kelvin equation:

$$\frac{P}{P_{sat}} = e^{2\gamma V_m / rRT}.$$

Where $P/P_{sat}$ is the ratio of the pressure to the saturated pressure, $\gamma$ is the surface tension, $V_m$ is the molar volume of the liquid, r is the radius of the droplet, R is the universal gas constant, and T is the absolute temperature. Vapor pressure is relevant in a variety of operational contexts, including, without limitation, atomic clocks.

BRIEF SUMMARY

In some examples, methods of using vapor cells may involve providing a vapor cell including a body defining a cavity within the body. At least a portion of at least one surface of the vapor cell within the cavity may include at least one pore having an average dimension of about 500 microns or less, as measured in a direction perpendicular to the at least one surface. A vapor pressure of a subject material may be controlled utilizing the at least one pore by inducing an exposed surface of a subject material in a liquid state within the at least one pore to have a shape different than a shape the exposed surface of the subject material in a liquid state would have on a flat, nonporous surface.

In other examples, vapor cells may include a body defining a cavity within the body. At least one surface of the vapor cell within the cavity may include at least one pore having an average dimension of about 500 microns or less, as measured in a direction parallel with the at least one surface. The at least one pore may be sized, shaped, positioned and configured to control a vapor pressure of a subject material within the cavity by inducing an exposed surface of subject material in a liquid state within the at least one pore to have a shape different than a shape the exposed surface of the subject material in a liquid state would have on a flat nonporous surface.

In other embodiments, methods of making vapor cells may involve forming a body of a vapor cell, the body defining a cavity within the body. At least one pore including an average dimension less than 500 microns may be formed in at least a portion of at least one surface of the vapor cell within the cavity, the average dimension being measured in a direction parallel with the at least one surface. The at least one pore may be sized, shaped, positioned, and configured to control a vapor pressure of a subject material within the cavity by inducing an exposed surface of subject material in a liquid state within the at least one pore to have a shape different than a shape the exposed surface of the subject material in a liquid state would have on a flat, nonporous surface.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings. In the drawings:

DETAILED DESCRIPTION

Figure 1A:
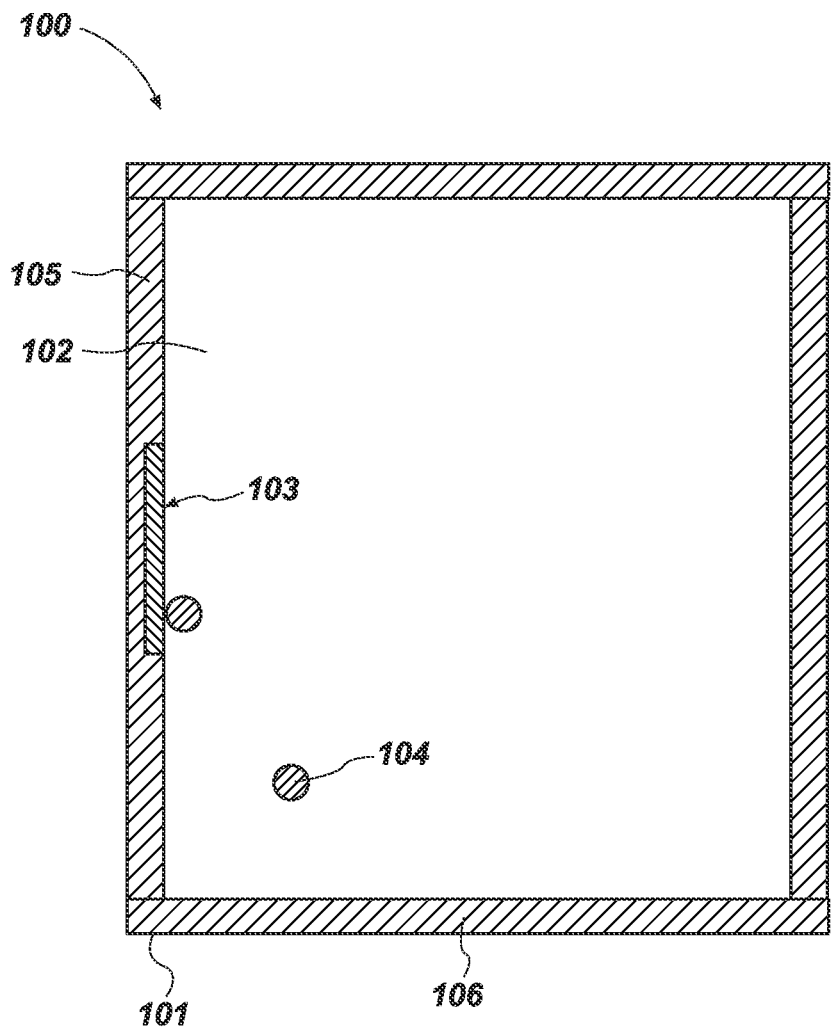
FIGS. 1A and 1B are schematic cross-sectional side views examples of vapor cells.

Disclosed examples relate generally to designs for microporous or nanoporous surfaces for, as a nonlimiting example, atomic clocks, which may, as a nonlimiting example, increase the temperature range over which reliable operation may be achieved. Porous surfaces may also be referred to herein as "capillary" surfaces. More specifically, disclosed examples relate to designs for porous surfaces for controlling (e.g., suppressing) vapor pressure. For example, at least one surface in a vapor cell may include one or more pores sized, shaped, positioned, and configured to control (e.g., suppress) vapor pressure of a subject material in the vapor cell. Such vapor pressure control may increase the temperature range over which reliable operation may be enabled. Some specific, non-limiting disclosed examples may involve modifying the surface roughness of the interior walls of an atomic vapor cell to form pores, or placing at least one mass (alternatively referred to as a "discrete mass," a "substrate," a "pellet," or a "quantity of non-subject material") including pores within a vapor cell, to reduce the vapor pressure of the alkali metal contained therein. Other specific, nonlimiting disclosed examples may, additionally or alternatively, reduce performance degradation of vapor-cell atomic clocks when operated in high ambient-temperature environments.

The illustrations presented in this disclosure are not meant to be actual views of any particular vapor cell, system including a vapor cell, mass including one or more pores, or component thereof, but are merely idealized representations employed to describe illustrative embodiments. Thus, the drawings are not necessarily to scale. In addition, certain features in the drawings are labeled as "optional," and certain actions in flowcharts are depicted in dashed lines to clearly indicate that those actions are "optional." Such labeling is not to be interpreted to mean that other features not labeled as "optional," and other actions in flowcharts depicted in solid lines, are required, critical, or otherwise necessary in connection with a given embodiment.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

The term "pore," as used herein, means and includes surface features having an average dimension less than 500 microns, as measured in a direction parallel to a major surface defining a cavity to which the pore is exposed. For example, "pores" include interconnected, three-dimensional networks of voids within a material that may be occupied by environmental fluids (e.g., air, inert gas). "Pores" also include, for example, depressions, divots, dimples, and other surface features having average dimensions less than 500 microns, which may be measurable as surface roughness.

The term "micropore," as used herein, means and includes pores having an average dimension between 1 micron and 500 microns, as measured in a direction parallel to a major surface defining a cavity to which the pore is exposed. The term "nanopore," as used herein, means and includes pores having an average dimension between 1 nm and 999 nm, (i.e., between 1 nm and less than 1 micron) as measured in a direction parallel to a major surface defining a cavity to which the pore is exposed.

Unless the context indicates otherwise, removal of materials or surface modifications described herein may be accomplished by any suitable technique including, but not limited to, etching (e.g., dry etching, wet etching, vapor etching), ion milling, abrasive planarization (e.g., chemical-mechanical planarization (CMP)), or other known methods.

The upper operating temperature of vapor-cell atomic clocks, such as chip scale atomic clocks (CSACs), without limitation, may be limited by excessive optical absorption and collisional line broadening due to the high density of alkali metal vapor at elevated temperatures. The vapor pressure above a liquid may be suppressed by altering the shape of the outer surface of the liquid, such as, for example, by containing the liquid within a capillary. Such a process may be applicable for depressing the alkali metal vapor pressure. In accordance with the Kelvin equation, a radius of the droplet is positive when the curvature of a droplet of subject liquid is convex, causing the vapor pressure to be greater than the saturation pressure. When the curvature of the droplet is concave, the radius of the droplet is negative, causing the vapor pressure to be less than the saturation pressure. When the vapor pressure is less than the saturation pressure, the vapor cell may be operable, providing more consistent and reliable behavior of the subject material, across a greater range of temperatures (e.g., temperatures between about −45° C. and about 250° C.), such as, for example, at high temperatures (e.g., temperatures of 90° C. or higher).

Reducing subject material vapor pressure within vapor cells of atomic clocks may be achieved by introducing at least one pore that utilizes the surface tension of masses of the subject material in the at least one pore to alter the shape of the mass of the subject material. Stated another way, the interaction between the subject material and the size and shape of a pore causes a shape of a surface of the subject material to change in a desired manner (e.g., introduces a disturbance) as compared to a shape of the surface of the subject material when on an at least substantially flat non-porous surface.

Figure 1B:
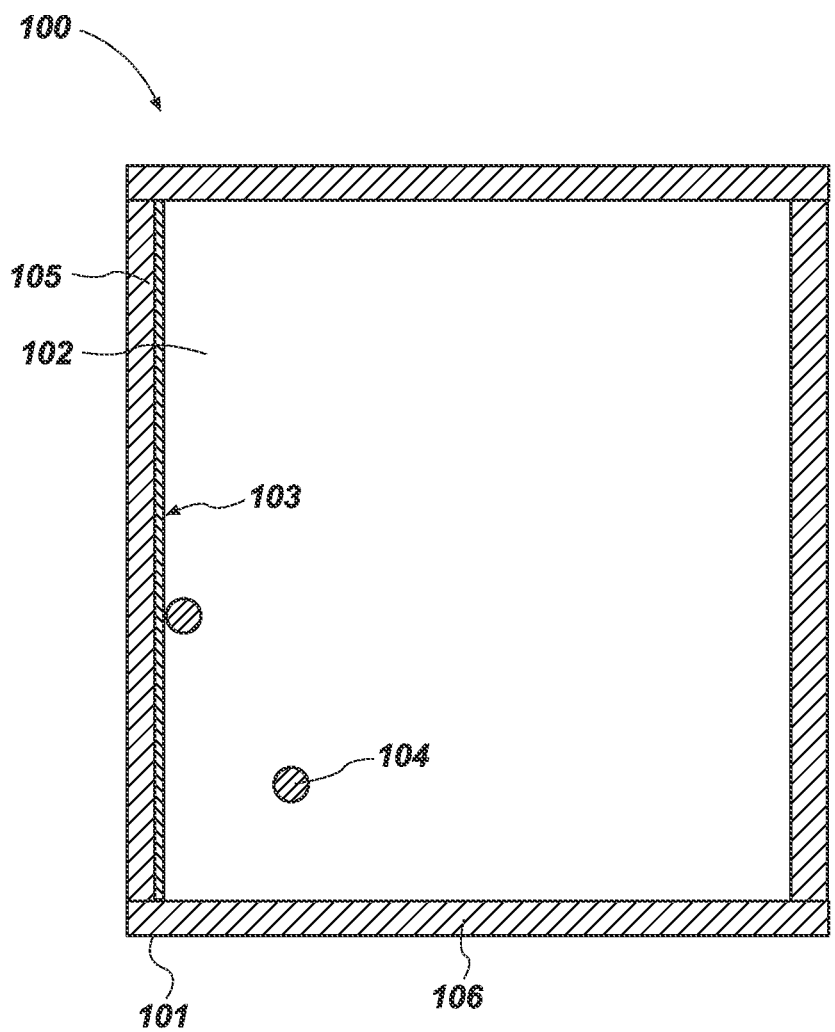

FIGS. 1A and 1B are schematic cross-sectional side views examples of vapor cells 100. Each vapor cell 100 may include, for example, a body 101 which contains a cavity 102. For example, the body 101 may include windows 106 forming one or more walls (e.g., boundaries) of the body 101, with the remaining sidewalls 105 being opaque. More specifically, the windows 106 may include, for example, a transparent or translucent borosilicate glass material, enabling the cavity 102 of the vapor cell 100 to be viewed through the windows 106. The sidewalls 105 of the vapor cell 100 may include a silicon material, such as, for example, when the vapor cell 100 is integrated into a chip-scale atomic clock or a chip-scale atomic magnetometer.

A transparency of the material of the windows 106 may be, for example, about 10% or more within wavelengths of radiation to be directed toward the cavity. More specifically, the transparency of the material of the windows 106 may be, for example, between about 10% and about 99%. As a specific, nonlimiting example, the transparency of the material of the windows 106 may be, for example, between about 20% and about 95% (e.g., about 25%, about 50%, about 75%).

At least one pore 103 may be positioned on a surface of the vapor cell 100 inside the cavity 102. Example pores 103 are visible in FIG. 3, which depicts a zoomed-in view of the pores 103 and surface. The cavity 102 may be sized, shaped, and configured to contain a quantity of a subject material 104. In some embodiments, such as that shown in FIG. 1A, one or more portions of one or more sidewalls 105 defining the cavity 102 may include one or more pores 103 exposed to the cavity 102. For example, a material of the relevant portion or portions of a given sidewall 105 itself may be porous, and at least some of the pores 103 of the portion of the sidewall 105 may be exposed to the cavity 102. More specifically, the portion of the sidewall 105 may be subjected to a process different from processing for a remainder of the sidewall 105 to introduce porosity into the portion of the sidewall 105, such as, for example, by forming an array of micropores, an array of nanopores, or an array of micropores and nanopores. As a specific, nonlimiting example, the portion of the sidewall 105 may be surface roughened or otherwise subjected to a material removal process (e.g., sand blasted, etched, ground) to form one or more pores 103 in the portion of the sidewall 105, which process may not be performed on the remainder of the sidewall 105, such that the remainder of the sidewall 105 may be at least substantially free of pores 103. Selective formation of pores in a given region of a surface of a sidewall 105 may be accomplished by, for example, masking techniques known in the art. By way of nonlimiting example, an aluminum hard mask may be employed in forming the at least one pore in the surface with the desired size, shape, and configuration. In one non-limiting example the surface roughness of the portion of the sidewall 105 exhibiting one or more pores 103 may be between about 5 nm and about 1 micron.

In other examples, such as that shown in FIG. 1B, at least substantially an entirety of one or more sidewalls 105 defining the cavity 102 may include one or more pores 103 exposed to the cavity 102. For example, a material of a given sidewall 105 itself may be porous, and at least some of the pores 103 of the sidewall 105 may be exposed to the cavity 102. More specifically, an entirety of a respective sidewall 105 may be subjected to a process different from processing for one or more other sidewalls 105 to introduce porosity into the respective sidewall 105. As a specific, nonlimiting example, the entirety of that portion of a sidewall 105 exposed to, and defining, the cavity 102 may be surface roughened or otherwise subjected to a material removal process (e.g., sand blasted, etched, ground) to form one or more pores 103 in the sidewall 105, which processing may not be performed on one or more others of the sidewalls 105, such that one or more others of the sidewalls 105 may be at least substantially free of pores.

In some examples, more than one surface within the cavity 102 may include pores 103 to tailor the vapor pressure of the subject material 104 to a target performance. For example, increasing the area over which the pores 103 may be distributed may result in a reduced sensitivity to the amount of subject material within the vapor cell. The at least one pore 103 may be positioned so as not to interfere with a light path between a source and a detector in a device, such as a CSAC. For example, the pores 103 may be positioned on opaque sidewalls 105 defining the cavity 102, and may be omitted from transparent windows 106 also defining the cavity 102.

The vapor cell 100 may be sized, shaped, and configured to enable a beam of radiation to pass through the body 101 and into the cavity 102. For example, the windows 106 of the body 101 may enable radiation of one or more wavelengths or wavelength spectra to pass through the windows 106 and into the cavity 102 when the vapor cell 100 is in operation. More specifically, the windows 106 may include a material (e.g., borosilicate glass) translucent or transparent to radiation (e.g., in the visible spectrum, infrared radiation, ultraviolet radiation, microwave radiation) directed toward the subject material 104 within the cavity 102.

The cavity 102 may be sized, shaped, and configured to contain the subject material 104, at least a portion of which may be in a vapor state and may be impacted by incident radiation when the vapor cell 100 is in operation. A cross-sectional shape of the vapor cell 100 may be any suitable shape, such as, for example, square, oval, circular, rectangular, polygonal, or irregular. The cavity 102 of the vapor cell 100 may have a volume of, for example, about $1 \times 10^6$ mm 3 or less. More specifically, the volume of the cavity 102 of the vapor cell 100 may be, for example, between about 0.1 mm$^3$ and about $1 \times 10^6$ mm$^3$. As a specific, nonlimiting example, the volume of the cavity 102 may be between about 1 mm$^3$ and about $5 \times 10^5$ mm$^3$ (e.g., about 10 mm$^3$, about 100 mm$^3$, about $1 \times 10^3$ mm$^3$, about $1 \times 10^4$ mm$^3$, about $1 \times 10^5$ mm$^3$). The cavity 102 may be, for example, hermetically sealed.

In the examples illustrated in FIGS. 1A and 1B, the cavity 102 may be enclosed by the sidewalls 105 and the windows 106. As illustrated in FIGS. 1A and 1B, the windows 106 may be positioned on opposing surfaces defining the cavity 102, with the sidewalls 105 oriented perpendicular to, and extending between, the windows 106. In other examples, the vapor cell may include more or fewer windows (e.g., no windows, one window, all surfaces formed as windows), sidewalls may be oriented at an oblique angle or may curve relative to the window or windows, one or more sidewalls may be located in the same plane as one or more of the corresponding windows, or any combination or subcombination of these features may be present.

As illustrated in FIGS. 1A and 1B, the pore 103 or pores 103 may be located directly in one or more of the surfaces defining the cavity 102, such as, for example, in the sidewall 105. For example, the material of the windows 106, the material of the sidewalls 105, or the material of the windows 106 and the material of the sidewalls 105 may define the pore 103 or pores 103. As another example, the material of the windows 106, the material of the sidewalls 105, or the material of the windows 106 and the material of the sidewalls 105 may be modified when forming the pore 103 or pores 103, such that the material defining the pores may be different from the material forming a remainder of the material of the windows 106, sidewalls 105, or both. More specifically, a process for forming the pore 103 or pores 103 may alter the material composition of the surfaces defining the pore 103 or pores 103, or the material of the surfaces defining the pore 103 or pores 103 may be deliberately altered following formation of the pore 103 or pores 103. As a specific, nonlimiting example, the material of the surfaces defining the pore 103 or pores 103 may include $SiO_2$.

As illustrated in FIG. 1A, the portion of the sidewall 105 including the pore 103 or pores 103 may be concentrated in a single, discrete region of the surface of the sidewall 105. In other examples, the sidewall 105 may include multiple discrete portions having pores 103 in different regions of the surface area of the sidewall 105. A number of discrete portions, a surface area occupied by a given discrete portion, at total surface area occupied by all portions, shapes of portions, positions of portions, sizes and shapes of pores 103 in the portion or portions, or any combination or subcombination of these features may be configured to induce the vapor pressure of a subject material 104 in the cavity 102 to be within predetermined thresholds in anticipated operating conditions for the vapor cell 100.

As illustrated in FIG. 1B, one or more sidewalls 105 defining the cavity 102 may include pores 103 exposed to the cavity 102, and one or more other sidewalls 105 defining the cavity 102 may lack pores 103. For example, one, some, or all of the sidewalls 105 may be porous and/or have a surface roughness to form pores 103 proximate to the cavity 102, and one or some of the sidewalls 105 may be nonporous.

Figure 2A:
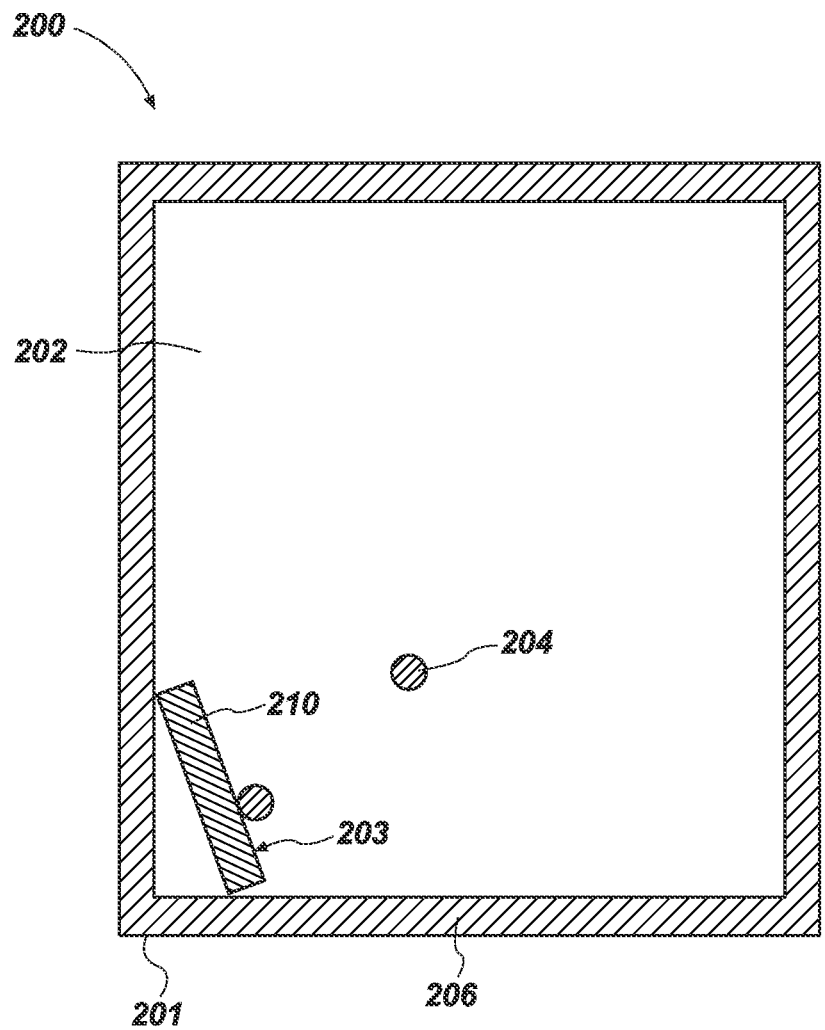
FIGS. 2A, 2B, and 2C are schematic cross-sectional side views of other examples of vapor cells.
Figure 2B:
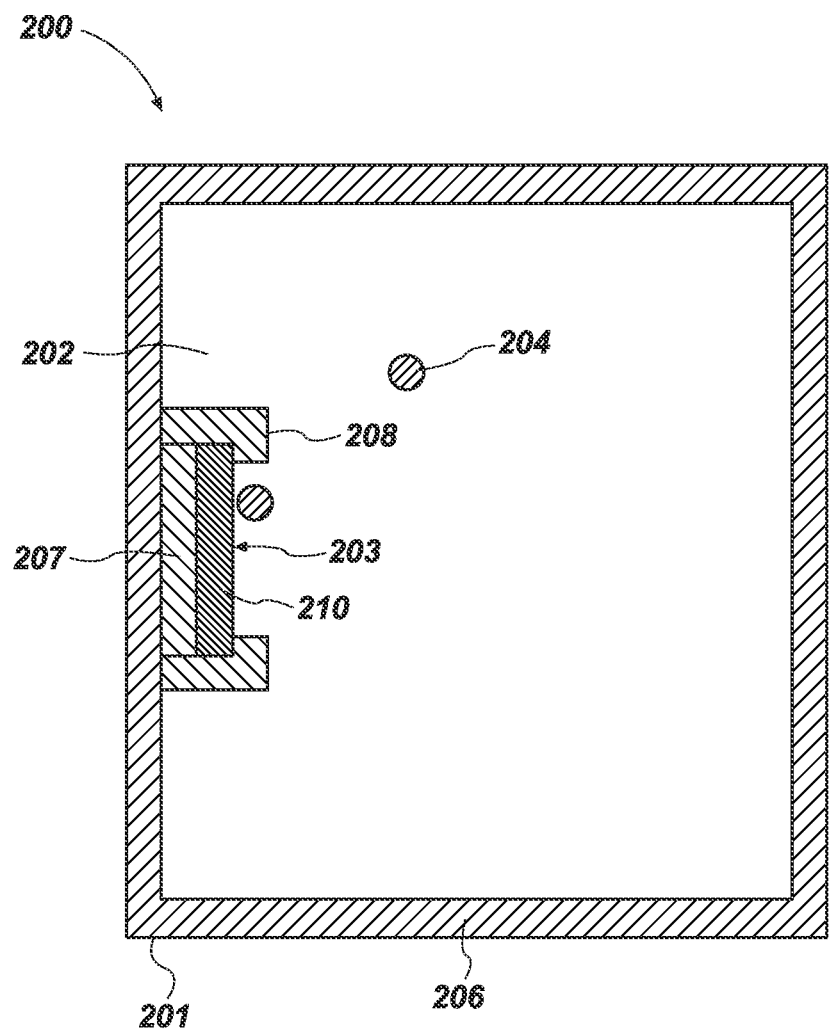
Figure 2C:
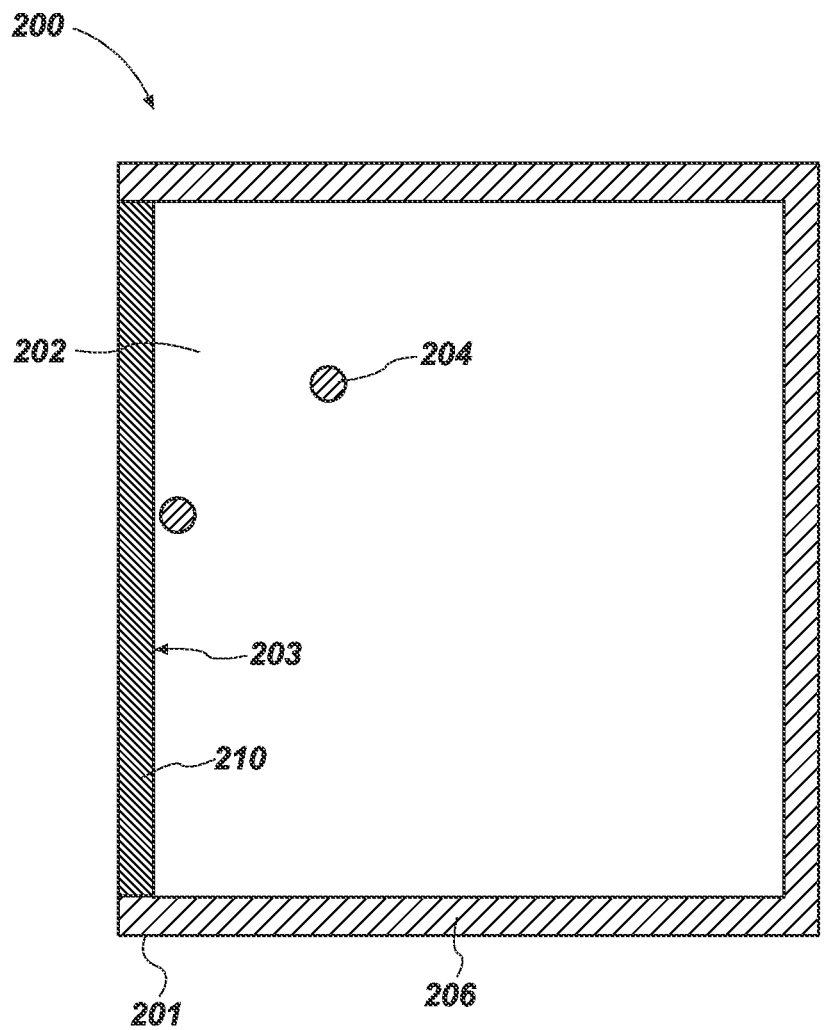

FIGS. 2A, 2B, and 2C are schematic cross-sectional side views of other examples of vapor cells 200. The vapor cells 200 may include a body 201 defining a cavity 202. A majority of surfaces defining the body 201 may be formed from windows 206, as shown in FIGS. 2A, 2B, and 2C. For example, an entirety of the body 201 may be formed of a material transparent to a predetermined wavelength of radiation, such that the body 201 is composed of a window 206, as shown in FIGS. 2A and 2B. More specifically, the body 201 may include, for example, a discrete, unitary mass of a transparent material enclosing the cavity 202. As a specific, nonlimiting example, the body 201 may include a mass of borosilicate glass defining the cavity 202. As another example, a majority or all but one of the surfaces of the body 201 may be formed of the transparent material, such that the body 201 is largely composed of a window 206 or windows 206, as shown in FIG. 2C. More specifically, the body 201 may include, for example, a first mass of a transparent material defining a first portion, and forming a majority, of the cavity 202 and a second mass of an opaque material defining a second, different portion, and forming a minority, of the cavity 202. As a specific, nonlimiting example, the body 201 may include a mass of borosilicate glass located around and securing a mass of silicon material, the mass of silicon material forming only one surface defining the cavity 202.

At least one mass 210 including one or more pores 203 may be introduced inside the cavity 202. The mass 210 disclosed herein may alternatively be referred to as a "discrete mass" a "substrate," a "pellet," or a "quantity of non-subject material." The mass 210 may include any material capable of defining the pores 203 and suitable for use in the anticipated operating conditions for the cavity 202 of the vapor cell 200. For example, the material of the mass 210 may be non-reactive with the subject material 204, and atmospheric material within the cavity 202, and the material of the body 201. More specifically, the mass 210 may include, for example, a silicon material. The mass 210 may include one or more pores 203 exposed to the interior of the cavity 202.

As illustrated in FIG. 2A, the mass 210 or may be movable within the cavity 202. For example, the mass 210 may be confined within the cavity 202 by the body 201 and may be otherwise detached from, and unconstrained by, the body 201 and any other structures within the cavity. More specifically, the mass 210 may be, for example, free to move within the cavity 202, lacking any physical, chemical, or other attachment to the walls of the body 201 defining the cavity 202. As a specific, nonlimiting example, the mass 210 may be discrete from, and free to move relative to, the body 201 with the walls of the body 201 defining the cavity 202 forming the only constraint on movement of the mass 210 within the cavity 202.

As illustrated in FIG. 2B, the mass 210 may be affixed to, and movable with, the body 201. For example, the mass 210 may be affixed to the body utilizing a bracket 208, an adhesive 207, or a combination or subcombination of these and/or other techniques for affixing a mass 210 to a body 201 within a cavity 202 defined by a body 201.

As illustrated in FIG. 2C, the mass 210 may form a sidewall partially defining the cavity 202 and affixed to a remainder of the body 201. For example, the material of the remainder of the body 201 may be provided around the mass 210 in a deformable state, and subsequently fixed in place around the mass 210 to affix the mass 210 to the remainder of the body 201. More specifically, the material of the window 206 may be positioned around the material of the mass 210 in a deformable state (e.g., when blowing the window 206 from a borosilicate glass material), and the mass 210 may be affixed to a portion of the window 206 surrounding a corresponding portion of the mass 210 as the window 206 cools, such that the mass 210 may form one surface defining the cavity 202 and the window 206 may form a remainder of the surfaces defining the cavity 202. A geometry of the cavity 202 may constrain position of the mass 210 in a specific location within the cavity 202. More specifically, borosilicate glass of the body 201 in a heated, viscous state may be placed around and in contact with surfaces of the mass 210, and the body 201 may be cooled to a higher-viscosity or solid state to affix the mass 210 to the remainder of the body 201. As a specific, nonlimiting example, the body 201 and the mass 210 may be bound together by means of anodic bonding.

In some examples, a size, shape, number, and porosity of the mass 210 may be configured to tailor the vapor pressure of the subject material 204 to targeted performance. For example, decreasing the size of the pores 203 on the mass 210 may result in a corresponding increase in a maximum temperature at which the vapor pressure within the vapor cell 200 may be within specified target values. As another example, increasing the size of the pores 203 may result in a corresponding decrease in a minimum temperature at which the vapor pressure within the vapor cell 200 may be within specified target values.

Figure 3:
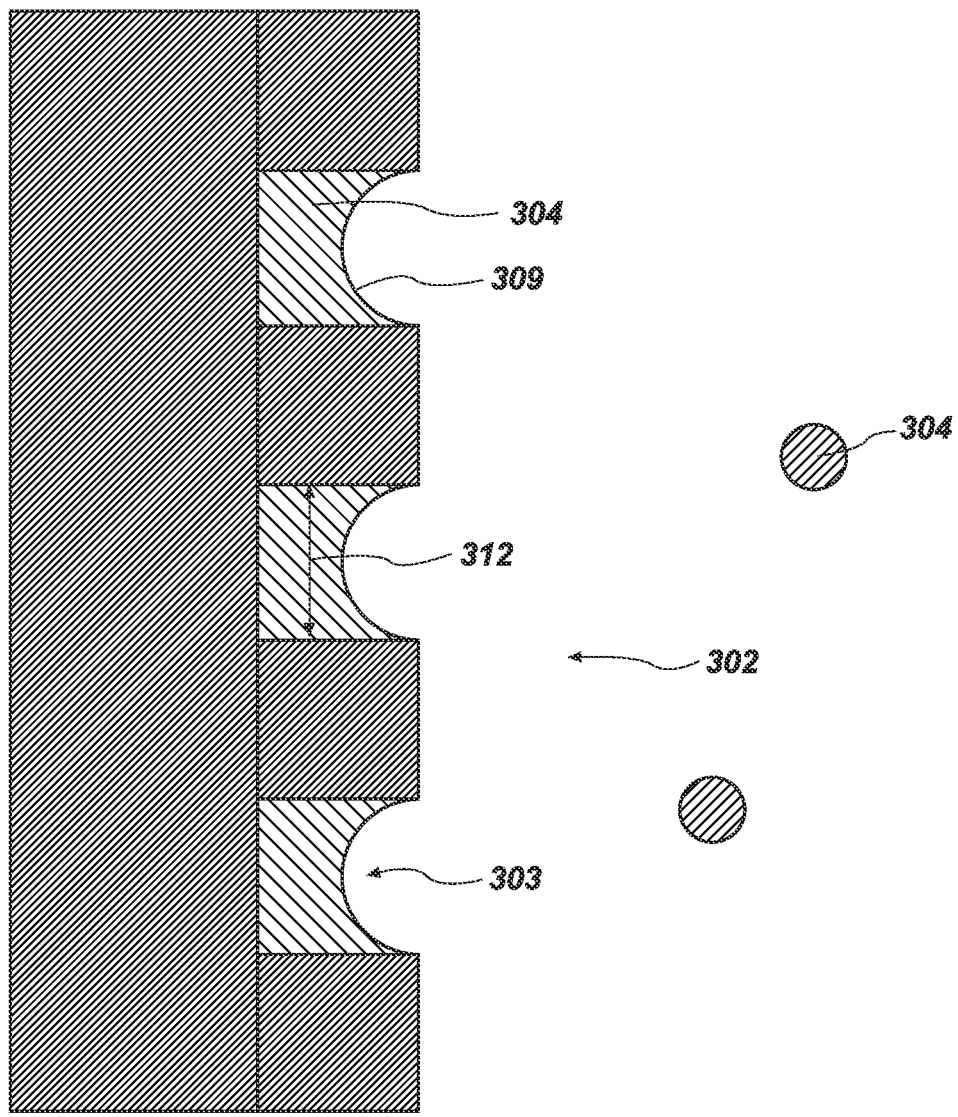
FIG. 3 is an enlarged, schematic cross sectional side view of a structure defining one or more pores exposed to a cavity of a vapor cell.

FIG. 3 is an enlarged, schematic cross sectional side view of a structure defining one or more pores 303 exposed to a cavity 302 of a vapor cell. An average dimension 312 of the pores 303 may be, for example, about 500 microns or less. More specifically, the average dimension 312 of the pores 303 in fluid communication with the cavity 302 may be, for example, between about 5 nm and about 500 microns, as measured in a direction parallel to a surface defining the cavity 302 to which the pores 303 may be exposed. As a specific, nonlimiting example, the average dimension 312 of the pores 303 exposed to the cavity 302 may be, for example, between about 25 nm and about 100 microns (e.g., about 50 nm, about 100 nm, about 500 nm, about 1 micron, about 25 microns, about 50 microns, about 75 microns).

The pores 303 may be sized and shaped to enable a meniscus 309 of a mass of the subject material 304 in a fluid state within the pores 303 to have a shape different than a shape an exposed surface of the subject material 304 in a liquid state would have on a flat, nonporous surface. For example, a radius of the meniscus 309 of the mass of subject material 304 in the fluid state within the pores 303 may be negative (i.e., the meniscus 309 may be concave). More specifically, the size and shape of the pores 303 may induce the meniscus 309 of the subject material 304 in the fluid state to have a concave shape through capillary action (e.g., the pores 303 may include capillaries), such that the height of the subject material 304 in the center of the pores 303 is less than the height of the subject material 304 near the wall of the pores 303.

Controlling the shape of the meniscus 309 of the subject material 304 in the fluid state within the pores 303 may affect the vapor pressure of the subject material 304 within the cavity 302. For example, inducing the meniscus 309 of the subject material 304 in the liquid state within the cavity 302 to have a negative radius may cause a vapor pressure of the subject material 304 within the cavity 302 to be less than a saturation pressure of the subject material 304 in a vapor state within the cavity 302. More specifically, the size and shape of the pores 303, and the corresponding size and shape of the meniscus 309 of the subject material 304 within the pores 303, may cause a greater proportion of the subject material 304 within the cavity 302 to be in the liquid state than a proportion of the subject material 304 that would be in the liquid state absent the pores 303. As a specific, nonlimiting example, the presence, size, and shape of the pores 303 may induce a localized phase change in the subject material 304 from vapor to liquid.

Figure 4:
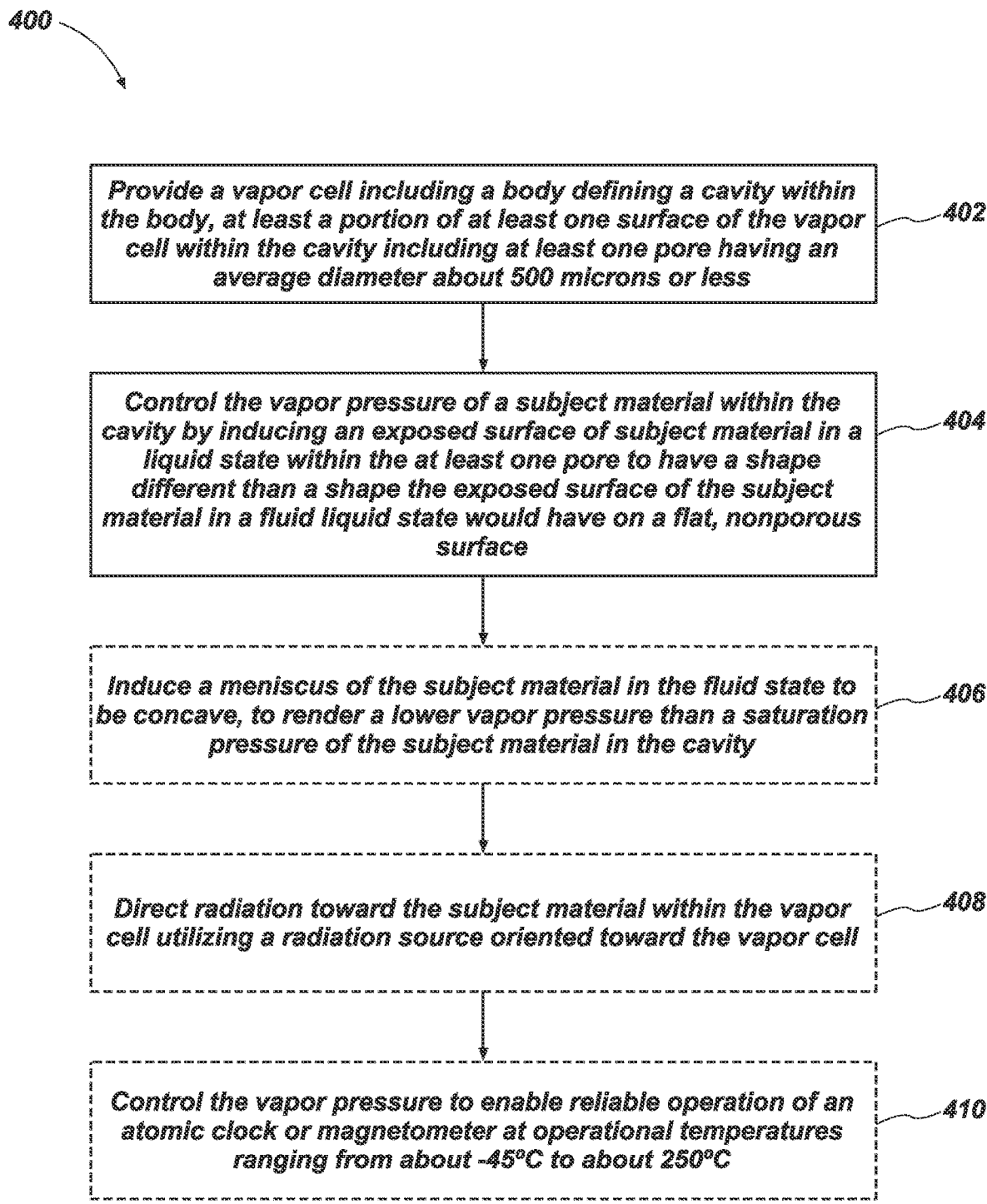
FIG. 4 is a flowchart depicting an illustrative method of using a vapor cell.

FIG. 4 is a flowchart depicting an illustrative method 400 of using a vapor cell. The method 400 may involve, for example, providing a vapor cell including a body defining a cavity within the body, as shown at act 402. At least a portion of at least one surface of the vapor cell within the cavity may include at least one pore having an average dimension about 500 microns or less, as measured in a direction parallel with the at least one surface, as also shown at act 402. More specifically, one or more of the vapor cells 100, 200 depicted in FIGS. 1A, 1B, 2A, 2B, and 2C may be provided. In some examples, the at least one surface of the vapor cell including the pore or pores may be a surface of a body of the vapor cell defining the cavity. In other examples, the at least one surface of the vapor cell including the pore or pores may be a mass discrete from the body and located within the cavity.

The vapor pressure of the subject material within the cavity may be controlled, as indicated at act 404. Control over the vapor pressure may be achieved by, for example, providing a subject material within the cavity of the body with the pore or pores, ensuring that a quantity of the subject material within the cavity is insufficient to fully saturate (e.g., to fully occupy) the pore or pores under anticipated operating conditions, and controlling a pressure and a temperature within the cavity (e.g., by inducing a selected pressure within the cavity, by transferring heat to or from the cavity, by exposing the vapor cell to conditions in the operating environment) to induce a portion of the subject material to be in a vapor state within the cavity and another portion of the subject material to be in a liquid state within one or more pores. In some examples, an exposed surface of the subject material in a liquid state within the at least one pore may be induced to have a shape different than a shape the exposed surface of the subject material in a fluid liquid state would have on a flat, nonporous surface, as also indicated at act 404. More specifically, a meniscus of the subject material in the liquid state may be induced to be concave in some examples, as further indicated at act 406, rendering a vapor pressure of the subject material lower than a saturation pressure of the subject material in the cavity. As a specific, nonlimiting example, a size, shape, and position of the pores within the cavity may induce the subject material in the liquid state within the pores to have a concave shape through capillary action.

In some examples, radiation may be directed toward the subject material within the vapor cell utilizing a radiation source oriented toward the vapor cell, as indicated at act 408. A phase change of the subject material from the vapor phase to a liquid phase may be induced by the at least one pore controlling a shape of a meniscus of the subject material to affect the vapor pressure.

In some examples, control of the vapor pressure while operating the vapor cell may enable reliable operation of an atomic clock or magnetometer incorporating the vapor cell at operational temperatures ranging from about −45° C. to about 250° C., as indicated at act 410. More specifically, vapor cells in accordance with this disclosure may enable reliable operation of an atomic clock or magnetometer incorporating the vapor cell at operational temperatures ranging from about −45° C. to about 125° C.

When operating a vapor cell in accordance with this disclosure, the vapor cell with the cavity may be placed in the path of radiation emittable by a radiation source (i.e., such that a subject material within the cavity may be impacted (e.g., excited) by incident radiation). The inclusion of the at least one pore may enable the vapor pressure of the subject material to be controlled relative to the saturation pressure of the subject material. A meniscus of a mass of the subject material in a liquid state within the pore or pores may be induced to have a different shape from a shape the exterior surface of the subject material would have in the liquid state on a flat, non-porous surface, which may affect the vapor pressure of the subject material.

Figure 5:
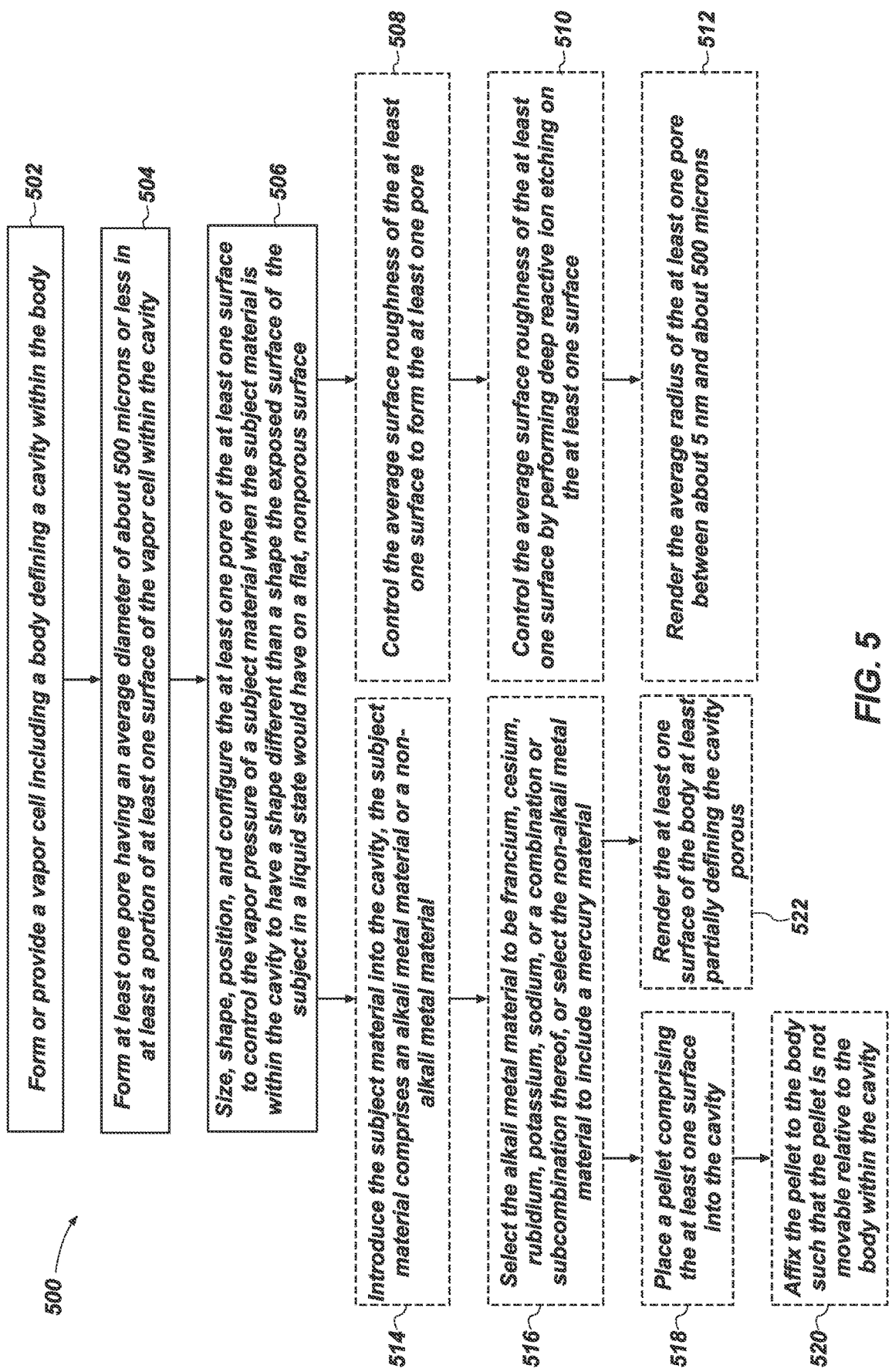
FIG. 5 is another flowchart depicting an illustrative method of making a vapor cell.

FIG. 5 is another flowchart depicting an illustrative method 500 of making a vapor cell. The method 500 may involve, for example, forming or providing a vapor cell including a body having a cavity defined by the body, as indicated at act 502. The body of the vapor cell may be configured to contain a subject material within the cavity. As specific, nonlimiting examples, the body of the vapor cell may take any of the forms, and may include any of the materials, described previously in connection with FIGS. 1A, 1B, 2A, 2B, and 2C.

At least one pore may be formed in at least a portion of at least one surface of the vapor cell within the cavity, as indicated at act 504. An average dimension of the pores, as measured in a direction parallel to the at least one surface, may be, for example, about 500 microns or less, as also indicated at act 504. The porosity of the at least one surface, or the surface roughness of the at least one surface defining the pores, may be configured to affect the vapor pressure of the subject material when the subject material is within the cavity. The at least one pore of the at least one surface may be sized, shaped, positioned, and configured to control the vapor pressure of a subject material when the subject material is within the cavity to have a shape different than a shape the exposed surface of the subject material in a liquid state would have on a flat, nonporous surface, as indicated at act 506.

In some examples, the at least one pore may be formed by controlling an average surface roughness of the at least one surface, as indicated at act 508. Modifications to the surface roughness of the surface or surfaces exposed to the cavity to form the pores may be accomplished by, for example, sand blasting, grinding, or any other technique known in the art for producing pores of a predetermined average size and shape within a material by altering a surface roughness of the surface. As another example, the pores in the at least one surface may be formed by etching the surface. More specifically, deep reactive ion etching may be performed on the at least one surface to form the pores, as indicated at act 510. In some examples, an average dimension of the pores, as measured in a direction parallel to the at least one surface, may be, for example, between about 5 nm and about 500 microns, as indicated at act 512. The average dimension of the least one pore may be selected to enable a meniscus of a mass of the subject material in a liquid state within the pores to maintain a shape different than a shape the exposed surface of the subject material in a liquid state would have on a flat nonporous surface.

The subject material may be introduced into the cavity, as indicated at act 514. In some examples, the subject material may be selected to include an alkali metal material, as also indicated at act 514. More specifically, the subject material may be selected to include francium, cesium, rubidium, potassium, sodium, or a combination or subcombination thereof, as indicated at act 516. In other examples, the subject material may be selected to include a non-alkali metal material, as also indicated at act 514. For example, the subject material may include a mercury material (e.g., for use in a mercury ion clock), as also indicated at act 516. In some examples, the subject material may be selected to include a mixture of alkali metal materials.

In some examples, one or more surfaces of the body of the vapor cell defining or partially defining the cavity may be rendered porous, as indicated at act 522. For example, a material forming at least a portion of the body of the vapor cell itself, and positioned proximate to the cavity, may define the pores. More specifically, the material of at least a portion of the body exposed to the cavity may be modified in surface roughness and/or porosity to form the pores.

In other examples, at least one mass including at least one surface having one or more pores may be placed within the cavity, as indicated at act 518. For example, the mass may be affixed to the body, such that the mass is not movable relative to the body, within the cavity, as indicated at act 520.

More specifically, the mass may be affixed to the body utilizing a bracket, an adhesive, or a bracket and an adhesive.

Figure 6A:
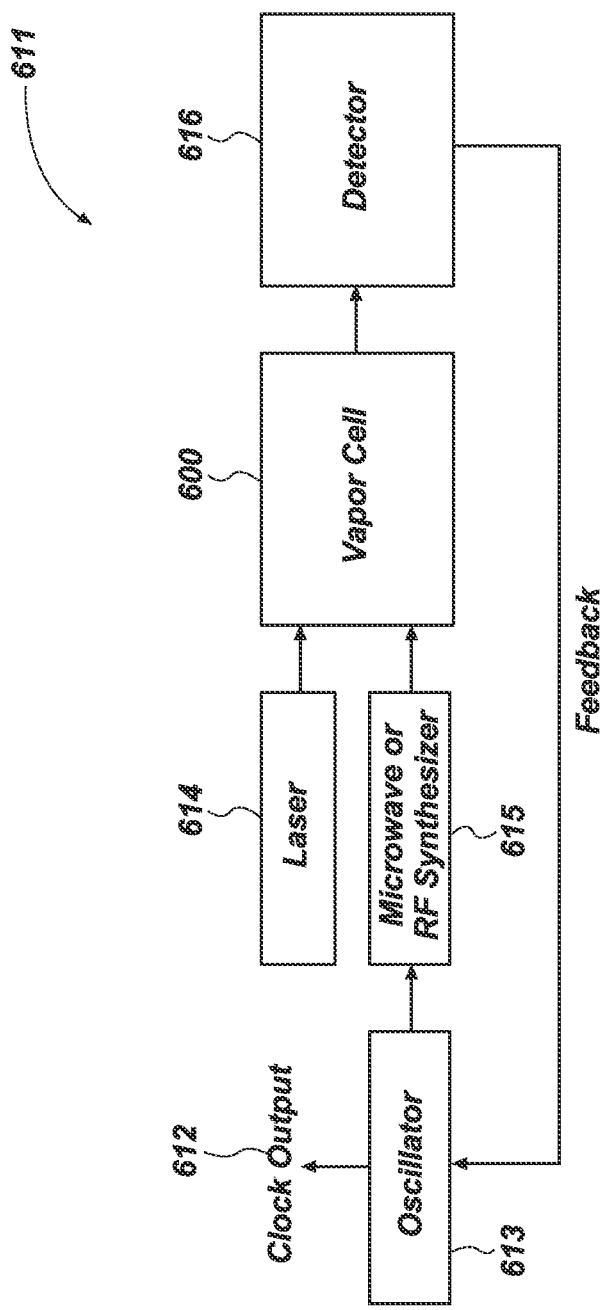
FIGS. 6A and 6B are schematics of illustrative systems including a vapor cell in accordance with this disclosure.
Figure 6B:
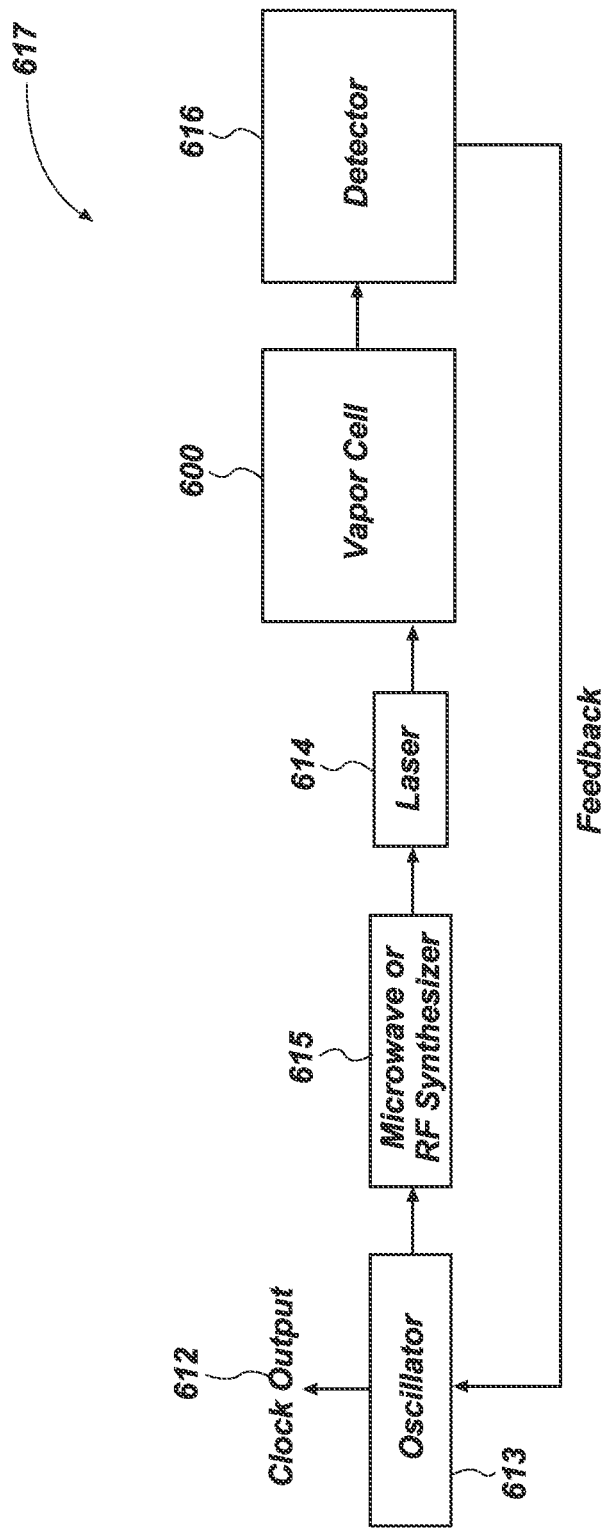

FIGS. 6A and 6B are schematics of illustrative systems 611 and 617 including a vapor cell 600 in accordance with this disclosure, differing in whether microwaves are applied directly to the vapor cell (600), as in a microwave-optical double-resonance clock or an Mx magnetometer shown in system 611, or applied as modulation to the laser bias current, as in a clock based on coherent population trapping or a Bell-Bloom type magnetometer shown in system 617. The systems 611 and 617 may be configured as, for example, atomic clocks, magnetometers, or gyroscopes.

The vapor cell 600 may include an examination region into which the vaporized atoms of the subject material may be directed, and one or more emitters may be configured to direct energy of a known type and intensity toward the examination region (e.g., a laser 614, a microwave 615, both a laser 614 and a microwave 615, without limitation). A detector 616 may include a sensor configured to detect one or more properties of the vaporized atoms of the subject material in response to the emitted energy. For example, the sensor of the detector 616 may be oriented toward the examination region and be configured to detect the transition of electrons of the subject material between energy levels, responsive to the energy from a first of the emitters (e.g., from the laser 614), as measured in variation of signal strengths relative to the frequency of the microwaves emitted by the second of the emitters (e.g., from the microwave 615).

One or more signals representative of the properties measured by the detector 616 may be provided as feedback to an oscillator 613. The oscillator 613 may be used to generate a clock output 612, which may be used as a clock signal itself or may be used to verify or synchronize another clock signal. In other words, the oscillator 613 may generate a clock output 612 timed to a frequency corresponding to the rate at which the atoms of the subject material transition between energy levels in response to changes in the frequency of radiation from a second emitter (e.g., the microwave 615) or in the frequency of signals from an RF synthesizer 615 as detected by corresponding changes in the frequency of the energy from the first emitter (e.g., the laser 614). The oscillator 613 may also be used to generate/synthesize microwave 615.

Such a system 611 or 617 may be particularly useful for generating, verifying, or synchronizing clock signals of high accuracy and/or in extreme environmental conditions (e.g., near vacuum, low or micro gravity, near earth orbit and/or space). Systems 611 and 617 in accordance with this disclosure may find application in the aerospace industry (e.g., to control clock signals in satellites and spacecraft), the telecom and banking industries (e.g., to verify or set clock signals for relevant computing systems), and in standard-setting situations (e.g., to establish timings for relevant standards). By reducing the vapor pressure of the subject material and reducing the vapor pressure of the subject material in the vapor cell of the system 611 or 617, the atomic clock can be configured to operate over a larger range of ambient temperatures.

While certain illustrative examples have been described in connection with the figures, the scope of this disclosure is not limited to those examples explicitly shown and described in this disclosure. Rather, many additions, deletions, and modifications to the examples described in this disclosure may be made to produce examples within the scope of this disclosure, such as those specifically claimed, including legal equivalents. In addition, features from one disclosed example may be combined with features of another disclosed example while still being within the scope of this disclosure.

What is claimed is:

1. A method of using a vapor cell, comprising:
providing a vapor cell comprising a body with a defined cavity within the body, at least a portion of at least one surface of the vapor cell within the cavity comprising at least one capillary;
inducing a negative meniscus of a subject material in a liquid state within the at least one capillary to be concave utilizing the at least one capillary; and
controlling a vapor pressure of the subject material utilizing the at least one capillary responsive to inducing the negative meniscus of the subject material.

2. The method of claim 1, wherein the at least one capillary comprises an array of capillaries and wherein inducing the negative meniscus of the subject material in the liquid state within the cavity to be concave utilizing the at least one capillary comprises inducing negative meniscuses, including the negative meniscus, of the subject material in the liquid state within the cavity to be concave utilizing the array of capillaries.

3. The method of claim 1, comprising directing radiation toward the subject material within the vapor cell utilizing a radiation source oriented toward the vapor cell.

4. The method of claim 3, wherein the body defining the cavity comprises windows partially defining the cavity and wherein directing the radiation toward the subject material within the vapor cell comprises directing the radiation through a window of the vapor cell lacking the at least one capillary.

5. The method of claim 1, comprising a mass discrete from the body located within the cavity and defining the at least a portion of the at least one surface of the vapor cell comprising the at least one capillary and comprising moving the mass relative to the body and within the cavity.

6. The method of claim 1, comprising a mass discrete from the body located within the cavity and defining the at least a portion of the at least one surface of the vapor cell comprising the at least one capillary and comprising constraining movement of the mass relative to the body and within the cavity.

7. The method of claim 1, wherein controlling the vapor pressure of the subject material utilizing the at least one capillary responsive to inducing the negative meniscus of the subject material comprises inducing the vapor pressure of the subject material within the cavity to be less than a saturation pressure of the subject material in a vapor state within the cavity.

8. The method of claim 1, wherein controlling the vapor pressure of the subject material utilizing the at least one capillary responsive to inducing the negative meniscus of the subject material comprises causing a greater proportion of the subject material within the cavity to be in the liquid state than a proportion of the subject material that would be in the liquid state absent the at least one capillary.

9. A system, comprising:
a vapor cell, comprising:
a body with a defined cavity within the body; and
at least one surface within the cavity comprising at least one capillary sized, shaped, positioned, and configured to control a vapor pressure of a subject material within the cavity utilizing at least one pore by inducing a negative meniscus of a subject material in a liquid state within the at least one capillary to be concave; and
an emitter oriented toward the vapor cell.

10. The vapor cell of claim 9, wherein the at least one surface within the cavity comprises a silicon material.

11. The vapor cell of claim 9, wherein the at least one surface within the cavity comprises at least one surface of the body at least partially defining the cavity.

12. The vapor cell of claim 9, wherein the at least one surface within the cavity comprises a mass of material within the cavity, the mass of material being discrete from the body.

13. The vapor cell of claim 9, wherein an average diameter of the at least one capillary is between 5 nm and 1 micron.

14. The vapor cell of claim 9, comprising a detector positioned and configured to detect one or more properties of vaporized atoms of the subject material responsive to emission of energy from the emitter.

15. The vapor cell of claim 14, comprising an oscillator configured to generate a clock output responsive to one or more signals representative of the one or more properties from the detector.

16. The vapor cell of claim 9, wherein the emitter comprises a laser, a microwave, or a laser and a microwave.

17. The vapor cell of claim 9, wherein the at least one capillary comprises an array of capillaries.

18. A method of making a vapor cell, comprising:
   forming a body of a vapor cell, the body with a defined cavity within the body;
   forming at least one capillary in at least a portion of at least one surface of the vapor cell within the cavity; and
   sizing, shaping, positioning, and configuring at least one pore to induce a negative meniscus of a subject material in a liquid state within the at least one capillary to be concave utilizing the at least one capillary to control a vapor pressure of the subject material utilizing the at least one capillary responsive to inducing the negative meniscus of the subject material.

19. The method of claim 18, comprising controlling an average surface roughness of the at least one surface to form the at least one capillary.

20. The method of claim 19, wherein controlling the average surface roughness of the at least one surface comprises performing deep reactive ion etching on the at least one surface.

* * * * *